(12) United States Patent
Ha

(10) Patent No.: US 10,818,526 B2
(45) Date of Patent: Oct. 27, 2020

(54) APPARATUS OF CONTROLLING TEMPERATURE IN WAFER CLEANING EQUIPMENT AND METHOD THEREOF

(71) Applicant: SK SILTRON CO., LTD, Gumi-si, Gyeongsangbuk-do (KR)

(72) Inventor: Se Geun Ha, Gumi-si (KR)

(73) Assignee: SK SILTRON CO., LTD (KR)

( * ) Notice: Subject to any disclaimer, the term of this patent is extended or adjusted under 35 U.S.C. 154(b) by 33 days.

(21) Appl. No.: 16/040,401

(22) Filed: Jul. 19, 2018

(65) Prior Publication Data

US 2019/0035656 A1   Jan. 31, 2019

(30) Foreign Application Priority Data

Jul. 26, 2017   (KR) .................. 10-2017-0094514

(51) Int. Cl.
| | | |
|---|---|---|
| H01L 21/30 | (2006.01) | |
| H01L 21/67 | (2006.01) | |
| H01L 21/304 | (2006.01) | |

(52) U.S. Cl.
CPC ...... *H01L 21/67248* (2013.01); *H01L 21/304* (2013.01); *H01L 21/67057* (2013.01)

(58) Field of Classification Search
CPC ................................................. H01L 21/67248
See application file for complete search history.

(56) References Cited

FOREIGN PATENT DOCUMENTS

| JP | 100289894 A | 10/1998 |
|---|---|---|
| JP | 2005-101037 A | 4/2005 |
| JP | 2006234382 A | 9/2006 |
| JP | 2007155382 A | 6/2007 |

(Continued)

OTHER PUBLICATIONS

KIPO Notice of Allowance dated Mar. 27, 2019, for corresponding KR Application No. 10-2017-0094514 (2 pages).

(Continued)

*Primary Examiner* — Jason Y Ko
(74) *Attorney, Agent, or Firm* — Lewis Roca Rothgerber Christie LLP

(57) ABSTRACT

The present invention relates to an apparatus of controlling a temperature of a wafer cleaning equipment capable of quickly and accurately determining a detection abnormality of a temperature sensor located inside a cleaning tank, and a method of controlling a temperature using the same.

The apparatus of controlling a temperature of a wafer cleaning equipment and the method of controlling a temperature using the same according to the present invention may determine an abnormal operation of a first temperature sensor installed at an inner side of an inner tank by comparing a measurement value of the first temperature sensor installed at the inner side of the inner tank and a measurement value of a second temperature sensor installed at a transfer robot configured to transfer wafers to the inner side of the inner tank.

Meanwhile, a method of controlling a temperature of a wafer cleaning equipment according to the present invention may determine an abnormal operation of temperature sensors by comparing measurement values of the temperature sensors installed at an inner side of each of inner tanks in a state of supplying deionized water of a set temperature to each of the inner tanks after discharging a cleaning solution accommodated in each of the inner tanks of a plurality of cleaning tanks.

6 Claims, 5 Drawing Sheets

(56) References Cited

FOREIGN PATENT DOCUMENTS

| JP | 2010034211 A | 2/2010 |
|---|---|---|
| JP | 3169239 U | 7/2011 |
| KR | 2002-0093203 A | 12/2002 |
| KR | 20020093203 A | 12/2002 |
| KR | 100571628 B1 | 4/2006 |
| KR | 10-0659842 B1 | 12/2006 |

OTHER PUBLICATIONS

Japanese Office Action issued by JPO dated Jul. 2, 2019 for corresponding JP Application No. 2018-128706 (3 pages).
KIPO Office Action dated Oct. 5, 2018 for corresponding KR Application No. 10-2017-0094514 (4 pages).

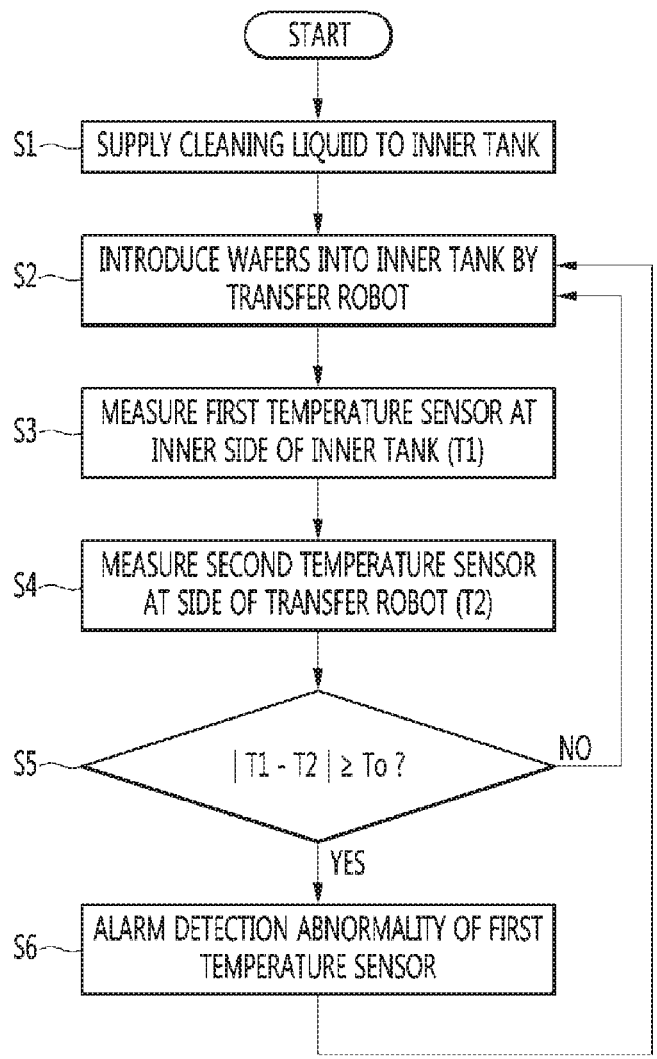

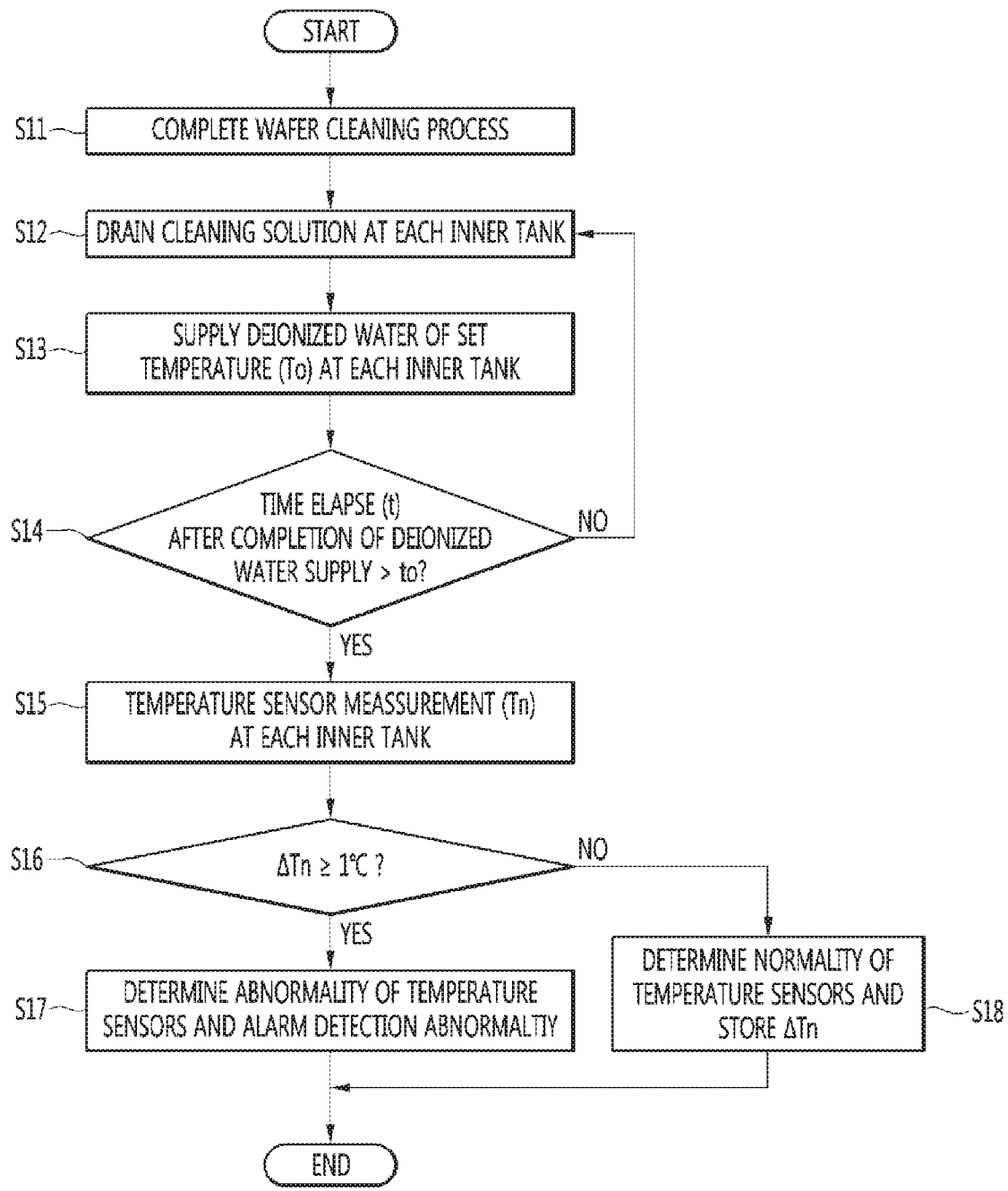

APPARATUS OF CONTROLLING TEMPERATURE IN WAFER CLEANING EQUIPMENT AND METHOD THEREOF

CROSS-REFERENCE TO RELATED APPLICATION

This application claims priority to and the benefit of Korean Patent Application No. 2017-0094514, filed on Jul. 26, 2017, the disclosure of which is incorporated herein by reference in its entirety.

BACKGROUND

1. Field of the Invention

The present invention relates to an apparatus of controlling a temperature of a wafer cleaning equipment capable of quickly and accurately determining a detection abnormality of a temperature sensor located inside a cleaning tank, and a method of controlling temperature using the same.

2. Discussion of Related Art

In general, a wafer widely used as a material for manufacturing a semiconductor device refers to a single crystal silicon thin plate formed of polycrystalline silicon as a raw material.

Such a wafer, after growing a polycrystalline silicon into a single crystal silicon ingot, is fabricated through a slicing process for slicing a single crystal silicon ingot into a wafer shape, a lapping process for uniformizing and planarizing thickness of a wafer, an etching process for removing or reducing damages caused by a mechanical polishing, a polishing process for mirror-polishing a surface of a wafer, and a cleaning process for cleaning a wafer, and the like.

In general, a cleaning process of a wafer is performed by a batch process, which is a method such that a cassette accommodating a plurality of wafers is immersed in a cleaning tank containing a cleaning solution.

However, recently, a rate of etching a wafer surface during the cleaning process of the wafer is also precisely controlled according to a trend of high density of a semiconductor device.

FIG. 1 is a configuration diagram illustrating a general wafer cleaning equipment.

As shown in FIG. 1, a general wafer cleaning equipment is provided such that wafers W are introduced into an inner tank 1a containing a cleaning solution, and an outer tank 1b capable of containing the cleaning solution overflowed from the inner tank 1a is provided, and a circulation flow path L for circulating the cleaning solution from the outer tank 1b to the inner tank 1a is provided.

In addition, a heater H for heating the cleaning solution flowing along the circulation flow path L is installed, and a temperature sensor 2 for measuring a temperature of the cleaning solution is provided at an inner side of the inner tank 1a, and a controller C for controlling an operation of the heater H according to a measurement value of the temperature sensor 2 is provided.

In general, a strong alkaline cleaning solution such as potassium hydroxide (KOH) or the like is used to clean the silicon wafer W. A surface of the wafer W is etched by such a strong alkaline cleaning solution during the cleaning process of the wafer W. In order to maintain an etching rate of the wafer W constant, the temperature of the cleaning solution should be maintained uniform.

Korean Patent No. 659842 discloses a temperature maintaining apparatus of a chemical solution tank capable of maintaining a surface of a wafer uniform by maintaining temperature of the chemical solution tank constant even when a wafer is introduced, by controlling a heater according to the number of wafers when a wafer is introduced into the chemical solution tank.

FIG. 2 is a graph illustrating a measured temperature value of a cleaning solution of a wafer cleaning equipment according to the related art, and FIG. 3 is a graph illustrating a wafer etching rate of a wafer cleaning equipment according to the related art.

According to the related art, when a measurement value of a temperature sensor is suddenly increased in a specific section A as shown in FIG. 2, accordingly, an operation of a heater is controlled to control the temperature of the cleaning solution to be lowered to an appropriate temperature, thereby maintaining an etching rate of a wafer constant.

However, even though the temperature of the cleaning solution is uniformly controlled in the section A in which a measurement value of the temperature sensor is increased, as shown in FIG. 3, it can be seen that the etching rate of the wafer has dropped remarkably in the specific section A, which can be considered as abnormal operation of the temperature sensor.

For example, when the temperature sensor is etched or corroded as it is exposed to a strong alkaline cleaning solution for a long time, or when the temperature sensor is failed due to other factors, the temperature sensor may operate abnormally.

As described above, according to the related art, even though the temperature sensor operates abnormally due to etching, corrosion, failure or the like of the temperature sensor installed at an inner side of an inner tank, the abnormality cannot be determined accurately. Therefore, even though a wafer is contaminated with metal due to etching or corrosion of the temperature sensor or a temperature of the cleaning solution is controlled based on a measurement value of the temperature sensor, it is difficult to maintain quality of the wafer uniform.

SUMMARY OF INVENTION

The present invention is directed to solving the above-described problems in the related art and providing an apparatus of controlling a temperature of a wafer cleaning equipment capable of quickly and accurately determining a detection abnormality of a temperature sensor located inside a cleaning tank, and a method of controlling a temperature using the same.

The present invention is directed to providing an apparatus of controlling a temperature of a wafer cleaning equipment including: a cleaning tank including an inner tank configured to accommodate a cleaning solution for cleaning wafers accommodated in a cassette and an outer tank configured to accommodate the cleaning solution overflowing from the inner tank; a first temperature sensor provided at an inner side of the inner tank and configured to measure a temperature of the cleaning solution to generate a first measurement value; a circulation flow path configured to circulate the cleaning solution from the outer tank to the inner tank; a heater provided on the circulation flow path and configured to heat the cleaning solution according to the first measurement value of the first temperature sensor; a transfer robot configured to transfer the wafers to and out of the inner side of the inner tank while holding the cassette; a second temperature sensor provided in the transfer robot and configured to measure a temperature of the cleaning solution to generate a second measurement value; and a controller configured to compare the first measurement value of the first temperature sensor with the second measurement value of the second temperature sensor to determine a detection abnormality of the first temperature sensor.

The present invention is directed to providing a method of controlling a temperature of a wafer cleaning equipment including: holding wafers accommodated in a cassette by a transfer robot, introducing the wafers to an inner side of an inner tank accommodating a cleaning solution, and cleaning the wafers; measuring a temperature of the cleaning solution from a first temperature sensor provided at the inner side of the inner tank and a second temperature sensor provided at the transfer robot during the cleaning, and generating first and second measurement values; comparing the first measurement value with the second measurement value, and determining a detection abnormality of the first temperature sensor; and informing the detection abnormality of the first temperature sensor according to the determination result.

The present invention is directed to providing a method of controlling a temperature of a wafer cleaning equipment including: cleaning wafers by a cleaning solution accommodated in each of inner tanks of a plurality of cleaning tanks; after completion of the cleaning, draining the cleaning solution from each of the inner tanks of the plurality of cleaning tanks, measuring a temperature of deionized water from a first temperature sensor provided at an inner side of each of the inner tanks of the plurality of cleaning tanks in a state of supplying deionized water of a set temperature, and generating measurement values; comparing the measurement values of the first temperature sensors with each other, and determining a detection abnormality of the first temperature sensors; and informing the detection abnormality of the first temperature sensors according to the determination result.

BRIEF DESCRIPTION OF THE DRAWINGS

FIG. 5 is a flowchart illustrating a method of controlling a temperature of a wafer cleaning equipment according to a first embodiment of the present invention.

FIG. 6 is a flowchart illustrating a method of controlling a temperature of a wafer cleaning equipment according to a second embodiment of the present invention.

DETAILED DESCRIPTION OF THE EMBODIMENTS

Hereinafter, embodiments will be described in detail with reference to the accompanying drawings. However, the scope of the spirit of the present invention may be determined from the matters disclosed in the embodiments, and the spirit of the present invention of the embodiments include practical modifications such as addition, deletion, modification, and the like of components to the following proposed embodiments.

Figure 4:
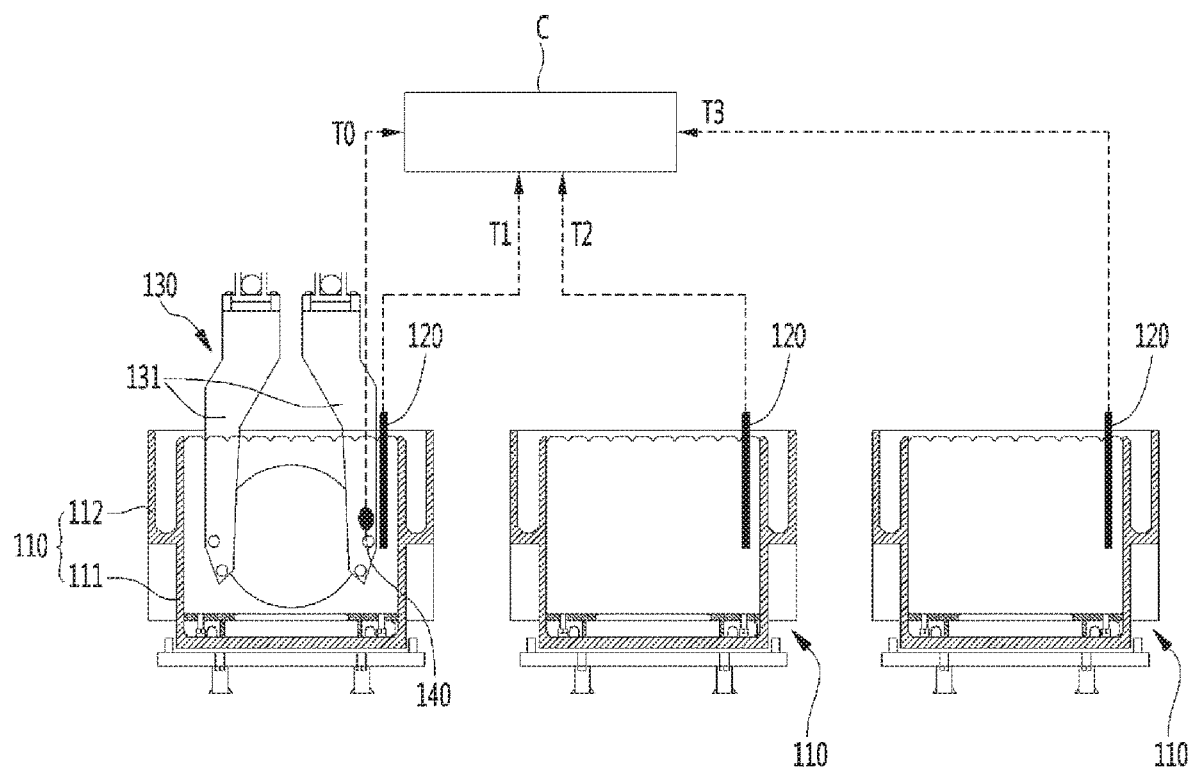
FIG. 4 is a configuration diagram illustrating an apparatus of controlling a temperature of a wafer cleaning equipment according to the present invention.

FIG. 4 is a configuration diagram illustrating an apparatus of controlling a temperature of a wafer cleaning equipment according to the present invention.

As shown in FIG. 4, the apparatus of controlling a temperature of a wafer cleaning equipment according to the present invention includes a plurality of cleaning tanks 110, a first temperature sensor 120 installed at an inner side of an inner tank 111 of each of the plurality of cleaning tanks 110, a second temperature sensor 140 installed at a transfer robot 130 holding a cassette accommodating wafers and introducing the wafers to the inner side of the inner tank 111, and a controller C configured to compare first and second measurement values of the first and second temperature sensors 120 and 140 and determine a detection abnormality of the first temperature sensor 120. The first measurement value may be generated by measuring a temperature of a cleaning solution by the first temperature sensor 120. The second measurement value may be generated by measuring a temperature of the cleaning solution by the second temperature sensor 140.

Figure 1:
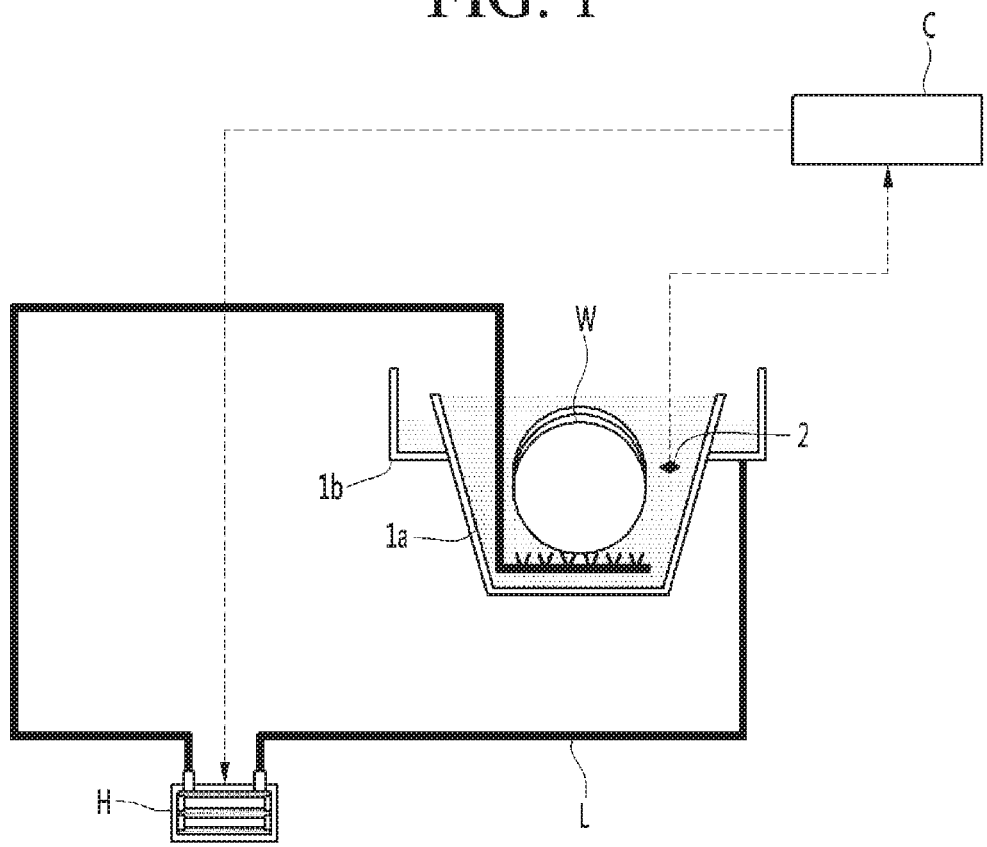
FIG. 1 is a configuration diagram illustrating a general wafer cleaning equipment.
Figure 2:
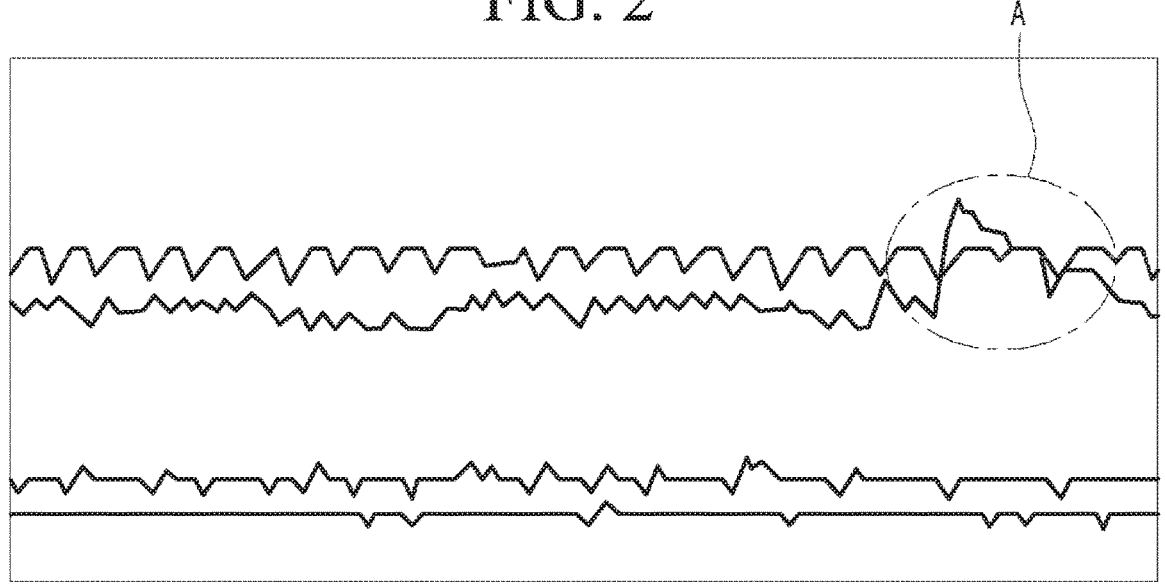
FIG. 2 is a graph illustrating a measured temperature value of a cleaning solution of a wafer cleaning equipment according to the related art.
Figure 3:
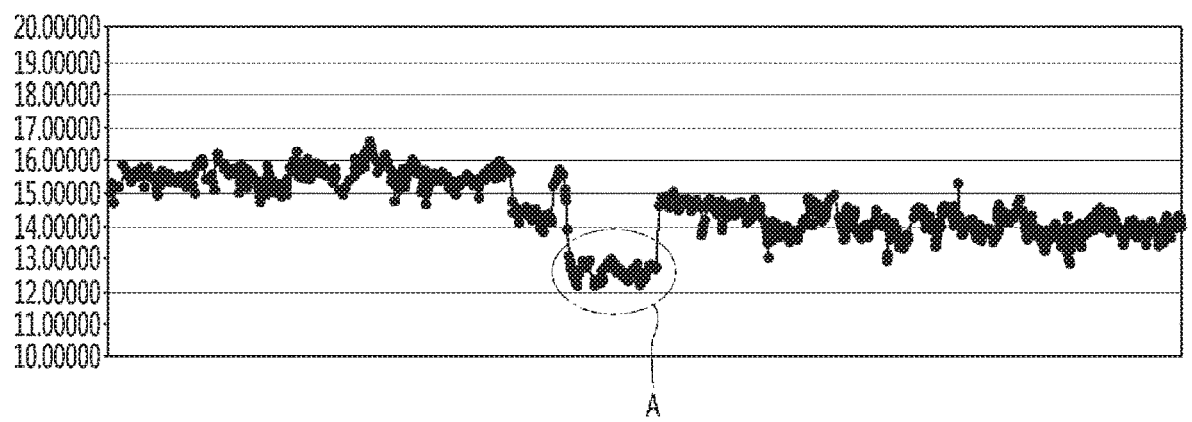
FIG. 3 is a graph illustrating a wafer etching rate of a wafer cleaning equipment according to the related art.

An outer tank 112 configured to collect an overflowed cleaning solution is installed at an outer side of the inner tank 111, a circulation flow path L (see FIG. 1) through which the cleaning solution may circulate is installed between the inner tank 111 and the outer tank 112, a heater H (see FIG. 1) configured to heat the cleaning solution is installed on the circulation flow path L (see FIG. 1), and the controller C controls an operation of the heater H (shown in FIG. 1) according to a measurement value of the first temperature sensor 120.

The first temperature sensor 120 is installed at the inner side of the inner tank 111, whereas the second temperature sensor 140 is installed at the transfer robot 130, so that the second temperature sensor 140 may be located in proximity to the first temperature sensor 120 at the inner side of the inner tank 111. That is, the second temperature sensor 140 may be located in a periphery of the first temperature sensor 120.

In an embodiment, the transfer robot 130 includes a pair of robot arms 131 capable of holding front and rear surfaces of the cassette, and it is preferable that the second temperature sensor 140 is installed in at least one of the robot arms 131 so as to get close to the first temperature sensor 120 when the robot arms 131 are introduced into the inner tank 111.

Accordingly, the first temperature sensor 120 is exposed to the cleaning solution for a long period of time while the cleaning solution is accommodated in the inner tank 111, whereas the second temperature sensor 140 is exposed to the cleaning solution only when the transfer robot 130 introduces the wafers into the cleaning solution of the inner tank 111, so that a risk of etching, corrosion, failure, or the like of the second temperature sensor 140 is relatively reduced as compared with that of the first temperature sensor 120.

In an embodiment, it is preferable that a platinum thermometer including a Teflon-based coating layer is used in the first and second temperature sensors 120 and 140 so as to withstand a strong alkaline cleaning solution.

The apparatus of controlling a temperature (see FIG. 5) of a wafer cleaning equipment according to a first embodiment of the present invention may determine malfunction of the first temperature sensor 120 by comparing the first measurement value of the first temperature sensor 120 installed at the inner side of the inner tank 111 of the cleaning tank 110 and the second measurement value of the second temperature sensor 140 installed at a side of the transfer robot 130 with each other during the cleaning process.

The apparatus of controlling a temperature (see FIG. 6) of a wafer cleaning equipment according to a second embodiment of the present invention, after the cleaning process is completed and then the cleaning solution is drained from the inner tank 111 of each of the cleaning tanks 110, may determine malfunction of each of the first temperature sensors 120 by comparing the measurement values of the first temperature sensors 120 installed at the inner side of the inner tank 111 with each other in a state of supplying deionized water of a set temperature.

FIG. 5 is a flowchart illustrating a method of controlling a temperature of a wafer cleaning equipment according to a first embodiment of the present invention.

The method of controlling a temperature of a wafer cleaning equipment according to the first embodiment of the present invention is directed to determining a detection abnormality of a temperature sensor during a cleaning process.

Referring to FIGS. 4 and 5, when the cleaning solution is supplied into the inner tank 111 of the cleaning tank 110 for the wafer cleaning process in step S1, the wafers are introduced into the inner tank 111 of the cleaning tank 110 by the transfer robot 130 in step S2.

The first temperature sensor 120 installed at the inner side of the inner tank 111 of the cleaning tank 110 may measure a first temperature T1 of the cleaning solution in step S3, and the second temperature sensor 140 installed at a side of the transfer robot 130 may measure a second temperature T2 of the cleaning solution in step S4.

The first temperature sensor 120 installed to be fixed at the inner side of the inner tank 111 of the cleaning tank 110 is exposed to the cleaning solution during the cleaning process, but the second temperature sensor 140 installed to be capable of transferring in and out of the inner tank 111 is exposed to the cleaning solution only when the wafers and/or the transfer robot 130 is transferred in and out during the cleaning process.

Accordingly, since a time for which the second temperature sensor 140 is exposed to the strong alkaline cleaning solution is shorter than that of the first temperature sensor 120 and a risk of damage or breakage is low, the second measurement value T2 of the second temperature sensor 140 may be more reliable than the first measurement value T1 of the first temperature sensor 120.

The controller C may compare the first and second measurement values T1 and T2 measured by the first and second temperature sensors 120 and 140 with each other in step S5. When a difference between the first measurement value T1 of the first temperature sensor 120 and the second measurement value T2 of the second temperature sensor 140 is equal to or greater than a set temperature To, the controller C determines that the first temperature sensor 120 is malfunctioning due to an abnormality, and informs a user of the detection abnormality of the first temperature sensor 120 in step S6. That is, the user may be informed of presence of the abnormality of the first temperature sensor 120.

When a difference between the measurement values T1 and T2 of the first and second temperature sensors 120 and 140 is less than the set temperature To, the controller C determines that the first temperature sensor 120 is operated normally, and may perform the cleaning process normally and continuously without a separate notice to the user.

FIG. 6 is a flowchart illustrating a method of controlling a temperature of a wafer cleaning equipment according to a second embodiment of the present invention.

The method of controlling the temperature of the wafer cleaning equipment according to the second embodiment of the present invention is directed to determining a detection abnormality of the temperature sensor 120 after the cleaning process is completed.

Referring to FIGS. 4 and 6, when the wafer cleaning process is completed in step S11, the cleaning solution is drained from the inner tank 111 of each of the cleaning tanks 110 in step S12.

During the cleaning process, the circulating cleaning solution is heated by the heater H (see FIG. 1) to maintain a temperature of the cleaning solution at 70 to 80° C., but when the cleaning process is completed, an operation of the heater is completely stopped.

Next, deionized water of a set temperature is supplied to each of the inner tanks 111 in step S13, and after a set time has elapsed in step S14, the temperature sensor 120 located at an inner side of each of the inner tanks 111 measures a temperature Tn of the deionized water in step S15.

Since the temperature of the cleaning solution accommodated during the cleaning process may affect the measurement value of the temperature sensor 120 immediately after the deionized water is supplied to each of the inner tanks 111, it is preferable that the deionized water is supplied to each of the inner tanks 111, and then the measurement of the temperature Tn of the deionized water is performed by each of the temperature sensors 120 after at least a set time has elapsed.

The controller C may compare the measurement values T1 to Tn measured by the temperature sensor 120 of each of the cleaning tanks 110 with each other in step S16. When an error ΔTn between the measurement values T1 to Tn of the temperature sensor 120 of each of the cleaning tanks 110 is equal to or greater than a reference value of 1° C., the controller C determines that the temperature sensors 120 are malfunctioning due to an abnormality, and informs a user of the detection abnormality of the temperature sensors 120 in step S17.

When an error ΔTn between the measurement values T1 to Tn of the temperature sensor 120 of each of the cleaning tanks 110 is less than the reference value of 1° C., the controller C determines that the temperature sensors 120 are operated normally and accumulates and stores an error ΔTn between the measurement values T1 to Tn of the temperature sensor 120 of each of the cleaning tanks 110 in step S18.

As described above, the accumulatively stored error ΔTn between the measurement values T1 to Tn of the temperature sensors 120 may be utilized as a reference value for determining the error ΔTn between the measurement values T1 to Tn of the temperature sensors 120 when the detection abnormality of the temperature sensor 120 is determined while repeating the above-described process.

The apparatus of controlling a temperature of a wafer cleaning equipment and the method of controlling a temperature using the same according to the first embodiment of the present invention may determine an abnormal operation of the first temperature sensor 120 installed at the inner side of the inner tank 111 by comparing the measurement value of the first temperature sensor 120 installed at the inner side of the inner tank 111 of the cleaning tank 110 and the measurement value of the second temperature sensor 140 installed at the transfer robot 130 configured to transfer the wafers to the inner side of the inner tank 111.

Meanwhile, the method of controlling a temperature of a wafer cleaning equipment according to the second embodiment of the present invention may determine an abnormal operation of the temperature sensors 120 by comparing the measurement values of the temperature sensors 120 installed at the inner side of the inner tank 111 of each of the cleaning tanks 110 in a state of supplying deionized water of a set temperature to each of the inner tanks 111 after the cleaning solution accommodated in the inner tank 111 of each of the cleaning tanks 110 is discharged.

Therefore, according to an embodiment, even though the temperature sensor 120 installed at the inner side of the inner tank 111 operates abnormally due to etching, corrosion, failure or the like of the temperature sensor 120, it is possible to accurately and easily determine the abnormality. Accordingly, even though a wafer is contaminated with metal due to etching or corrosion of the temperature sensor 120 or the temperature of the cleaning solution is controlled based on a measurement value of the temperature sensor 120, it is possible to maintain quality of the wafer uniform.

What is claimed is:

1. An apparatus of controlling a temperature of a wafer cleaning equipment, comprising:
   a cleaning tank including an inner tank configured to accommodate a cleaning solution for cleaning wafers accommodated in a cassette and an outer tank configured to accommodate the cleaning solution overflowing from the inner tank;
   a first temperature sensor provided at an inner side of the inner tank and configured to measure a temperature of the cleaning solution and exposed to the cleaning solution throughout a cleaning process to generate a first measurement value;
   a circulation flow path configured to circulate the cleaning solution from the outer tank to the inner tank;
   a heater provided on the circulation flow path and configured to heat the cleaning solution according to the first measurement value of the first temperature sensor;
   a transfer robot configured to transfer the wafers to and out of the inner side of the inner tank while holding the cassette;
   a second temperature sensor provided in the transfer robot and configured to measure a temperature of the cleaning solution and exposed to the cleaning solution only when the wafers are put in the cleaning solution during the cleaning process to generate a second measurement value; and
   a controller configured to compare the first measurement value of the first temperature sensor with the second measurement value of the second temperature sensor to determine a detection abnormality of the first temperature sensor,
   wherein the controller determines that the first temperature sensor is malfunctioning when a difference between the first measurement value and the second measurement value is equal to or greater than a set temperature.

2. The apparatus of controlling a temperature of a wafer cleaning equipment of claim 1, wherein the transfer robot includes a pair of robot arms capable of holding front and rear surfaces of the cassette,
   wherein the second temperature sensor is installed in at least one of the robot arms so as to get close to the first temperature sensor when the robot arm is introduced into the inner tank.

3. The apparatus of controlling a temperature of a wafer cleaning equipment of claim 2, wherein the second temperature sensor is a platinum thermometer including a Teflon-based coating layer.

4. The apparatus of controlling a temperature of a wafer cleaning equipment of claim 1, wherein the controller determines that the first temperature sensor is operating normally when a difference between the first measurement value and the second measurement value is less than a set temperature.

5. The apparatus of controlling a temperature of a wafer cleaning equipment of claim 1, wherein the cleaning tank and the first temperature sensor are provided in plural,
   wherein the controller drains the cleaning solution from the inner tank of each of the plurality of cleaning tanks, compares measurement values measured from each of the first temperature sensors of the plurality of cleaning tanks with each other in a state of supplying deionized water of a set temperature, and determines a detection abnormality of the first temperature sensors.

6. The apparatus of controlling a temperature of a wafer cleaning equipment of claim 1, wherein the second temperature sensor is configured to directly measure the temperature of the cleaning solution to generate the second measurement value.

* * * * *